(12) United States Patent
Kamikoriyama et al.

(10) Patent No.: US 8,012,378 B2
(45) Date of Patent: Sep. 6, 2011

(54) NICKEL INK

(75) Inventors: Yoichi Kamikoriyama, Ageo (JP);
Hiroki Sawamoto, Ageo (JP);
Mikimasa Horiuchi, Ageo (JP)

(73) Assignee: Mitsui Minning & Smelting Co., Ltd, Tokyo (JP)

( * ) Notice: Subject to any disclaimer, the term of this patent is extended or adjusted under 35 U.S.C. 154(b) by 15 days.

(21) Appl. No.: 12/296,449

(22) PCT Filed: Mar. 23, 2007

(86) PCT No.: PCT/JP2007/055995
§ 371 (c)(1),
(2), (4) Date: Oct. 8, 2008

(87) PCT Pub. No.: WO2007/116649
PCT Pub. Date: Oct. 18, 2007

(65) Prior Publication Data
US 2009/0053525 A1 Feb. 26, 2009

(30) Foreign Application Priority Data
Apr. 10, 2006 (JP) .................. 2006-107966

(51) Int. Cl.
*H01B 1/02* (2006.01)
(52) U.S. Cl. .......... 252/513; 252/512; 427/58; 427/123; 427/466
(58) Field of Classification Search .......... 252/512, 252/518.1, 519.3, 513; 427/58, 123, 466
See application file for complete search history.

(56) References Cited

U.S. PATENT DOCUMENTS

| | | | | |
|---|---|---|---|---|
| 4,587,038 A * | 5/1986 | Tamura | ........ | 252/511 |
| 4,911,864 A * | 3/1990 | Sato et al. | ........ | 252/519.31 |
| 2005/0014004 A1 * | 1/2005 | King et al. | ........ | 428/413 |
| 2005/0069648 A1 * | 3/2005 | Maruyama | ........ | 427/379 |
| 2006/0073667 A1 * | 4/2006 | Li et al. | ........ | 438/311 |
| 2008/0152926 A1 * | 6/2008 | Baikerikar et al. | ........ | 428/422.8 |
| 2009/0035472 A1 * | 2/2009 | Otsuka et al. | ........ | 427/380 |

FOREIGN PATENT DOCUMENTS

| | | |
|---|---|---|
| JP | 9-246688 | 9/1997 |
| JP | 2000-345081 | 12/2000 |
| JP | 2002-324966 | 11/2002 |
| JP | 2002-334618 | 11/2002 |
| JP | 2004-179125 | 6/2004 |
| JP | 2006-348160 | 7/2006 |
| WO | WO 2006/041030 | 4/2006 |
| WO | WO 2006/070747 | 7/2006 |
| WO | WO 2007/052564 | 5/2007 |

* cited by examiner

Primary Examiner — Harold Pyon
Assistant Examiner — Haidung Nguyen
(74) Attorney, Agent, or Firm — Young & Thompson

(57) ABSTRACT

Disclosed is a nickel ink comprising a dispersion medium and nickel particles dispersed in the medium and containing a methyldimethoxysilane coupling agent. The dispersion medium comprises a glycol having a boiling point of 300° C. or lower at ambient temperature, an alkoxyethanol having 3 to 10 carbon atoms, and an ether having 2 to 8 carbon atoms. The ink preferably has a surface tension adjusted to 15 to 50 mN/m and a viscosity at 25° C. adjusted to 0.6 to 60 mPa·sec. The ink is preferably used in inkjet printing.

9 Claims, No Drawings

NICKEL INK

TECHNICAL FIELD

This invention relates to nickel ink, a conductor film which is obtained by firing a coating film of the nickel ink, and a process of producing the conductor film.

BACKGROUND ART

Circuit pattern formation using metal nanoparticles having a particle size of nanometer order is known, and a number of techniques have recently been proposed in which a circuit is drawn or printed directly on a variety of substrates using a conductive metal ink (a metal ink containing metal nanoparticles) by means of an inkjet printer or a dispenser, and the applied ink is fired to form conductor wiring or electrodes. Circuit pattern formation on a variety of substrates by firing metal nanoparticles at low temperature is exemplified by the proposal of Patent Document 1. Circuit formation by inkjet printing a conductive metal ink is disclosed, e.g., in Patent Document 2.

The technique in which a circuit pattern is directly printed on a substrate by inkjet printing is attracting attention as a promising process allowing for great reduction of production cost because of a fewer number of steps involved and less waste from the steps than the generally spread, conventional circuit pattern forming technique utilizing photolithography. The conventional technique relying on photolithography is exemplified by the one disclosed in Patent Document 3.

We have thus seen the technological changes from photolithographic techniques into inkjet printing or dispenser techniques, which have enabled more convenient and less expensive circuit formation on a substrate. Nevertheless, the circuit formation technique using a conductive ink by inkjet printing or dispensing using a dispenser has not been widely spread primarily for the following reasons.

(i) The resulting conductor film lacks adhesion to various substrates, failing to fulfill fundamental characteristics required of a circuit board.
(ii) The resulting conductor film lacks sufficient surface smoothness. A circuit usually has a laminate structure including a base layer, so that it would have limited applicability in various respects unless the conductor film has sufficient surface smoothness. For example, a different component layer provided on a rough surface of a conductor film would be influenced by the underlying surface roughness and fail to maintain good thickness uniformity.

The problem (i) is believed to be largely caused by the characteristics of a dispersion medium used in a conductive ink. It is considered that the adhesion of a conductor film formed by firing applied ink to a substrate is governed by the chemical reaction between a binder component present in the dispersion medium and the substrate. The problem (ii) is believed to be caused by the characteristics of both the metal powder (metal particles) and the dispersion medium constituting a conductive ink. It is obvious that coarse metal particles make it impossible to form a conductor film with smooth surface. In addition to this, if the dispersion medium vigorously vaporizes and escapes from the inside of the conductor film during firing, it easily results in a failure to form a smooth film surface.

With respect to the binder component in ink, Patent Document 4 discloses using a silane coupling agent having a mercapto group or an amino group. The metal particles recited for use in the ink is gold, silver, platinum, copper, or palladium, but does not include nickel. Furthermore, the ink of Patent Document 4 is pasty with a relatively high viscosity and cannot be seen as suited to inkjet printing.

Patent Document 1 JP 2002-334618A
Patent Document 2 JP 2002-324966A
Patent Document 3 JP 9-246688A
Patent Document 4 JP 2004-179125A

DISCLOSURE OF THE INVENTION

An object of the invention is to provide a fine nickel particles-containing ink free from the above described problems associated with the conventional techniques.

The present invention provides a nickel ink comprising a dispersion medium and nickel particles dispersed in the dispersion medium and containing a methyldimethoxysilane coupling agent. The dispersion medium comprises a glycol having a boiling point of 300° C. or lower at ambient pressure, an alkoxyethanol having 3 to 10 carbon atoms, and an ether having 2 to 8 carbon atoms.

The invention also provides a conductor film which is obtained by firing a coating film of the nickel ink of the invention. The conductor film has an average surface roughness Ra of 10 nm or smaller and a maximum surface roughness $R_{max}$ of 200 nm or smaller.

The invention also provides a method of producing a conductor film comprising applying the nickel ink of the invention to a substrate and firing the resulting coating film at 150° C. to 950° C.

BEST MODE FOR CARRYING OUT THE INVENTION

The ink of the invention is an electrically conductive ink containing fine nickel particles, namely, a nickel ink. The nickel ink application field has demanded that a conductor film formed by using a nickel ink should have an average surface roughness Ra of 10 nm or smaller and a maximum surface roughness $R_{max}$ of 200 nm or smaller. Predicated on using nanonickel particles, the present invention now proposes a specific ink composition that succeeds in increasing the adhesion of a conductor film formed by using the ink to a variety of substrates. The conductor film has low electrical resistance and excellent surface smoothness.

The nickel ink of the invention has nickel particles dispersed in a dispersion medium. The ink contains a silane coupling agent having a specific structure.

The nickel particles used in the nickel ink preferably have an average primary particle size of 3 to 150 nm, more preferably 3 to 30 nm. Using nickel particles having a particle size within that range allows for forming a conductor film with the reduced average surface roughness Ra and maximum surface roughness $R_{max}$ as recited. In application to inkjet printing or the like, the ink containing the nickel particles in that range of particle size will prevent nozzle clogging. Furthermore, using nickel particles of that size will provide a thin conductor film as wiring and electrodes, facilitating fine wiring/electrode pattern formation. Examples of such nickel nanoparticles for use in the invention include NN-20 (trade name) available from the common assignee.

The average primary particle size of nickel particles can be determined by observing particles under a scanning electron microscope, adding up the particle sizes of at least 200 particles in a field of view, and averaging out.

The nickel particles' having a small average primary particle size provides evidence that the nickel particles are fine. Nevertheless, fine particles in ink may agglomerate into greater secondary particles, which deteriorate the conductor surface smoothness and, when used in inkjet printing or the like, can clog the nozzle. In this regard, it is preferred that the maximum size of the agglomerates (secondary particles) of the nickel particles in the conductive ink is 0.45 µm or less.

The nickel particles are not particularly limited in shape but are, in general, spherical. Nickel particles may be surface-treated with oleic acid, stearic acid, etc. unless such surface treatment brings about any disadvantage such as accelerating ink deterioration with time, deteriorating sintering characteristics, or causing an increase of resistance of the resulting conductor film.

The amount of the nickel particles in the ink is preferably 3% to 70% by weight, more preferably 5% to 70% by weight, even more preferably 5% to 65% by weight, still more preferably 5% to 60% by weight, most preferably 5% to 30% by weight. With the nickel particle content falling within the range recited, a conductor film obtained by firing the ink will have a high surface smoothness and an appreciably reduced thickness.

One of the features of the ink of the invention consists in use of a silane coupling agent having a specific structure, i.e., a methyldimethoxysilane coupling agent. A coating film of the ink containing the silane coupling agent exhibits improved dimensional stability while being fired to provide a conductor film with improved surface smoothness. The resulting conductor film also has high adhesion to a substrate.

Putting Si at the center, because a methyldimethoxysilane coupling agent takes on a straight linear structure relative to the configuration of the methoxy groups, shrinkage during firing occurs predominantly in two dimensions. As a result, the degree of shrinkage of the coating film is smaller than when shrinkage occurs in three dimensions. The surface smoothness of the coating film is therefore retained in the resulting conductor film. Because the groups released from the silane coupling agent during firing are only the methyl groups of the two methoxy groups, gas evolution accompanying firing is reduced, whereby the coating film is less liable to damage, which also contributes to surface smoothness retention by the conductor film.

The silane coupling agent used in the invention may have one reactive functional group bonded to Si in addition to one methyl group and two methoxy groups. Examples of the reactive functional group that may be possessed by the silane coupling agent include, but are not limited to, an alkyl group, an amino group, an epoxy group, a vinyl group, a styryl group, an acryloxy group, and a methacryloxy group. The alkyl group is exemplified by one having 1 to 16 carbon atoms, preferably 1 to 8 carbon atoms. Examples of the amino group include 3-aminopropyl, N-(2-aminoethyl)-3-aminopropyl, and N-phenyl-3-aminopropyl. Examples of the epoxy group include 3-glycidoxypropyl and 2-(3,4-epoxycyclohexyl)ethyl.

The amount of the silane coupling agent to be added is decided depending on the amount of the nickel particles in the ink. The amount of the coupling agent is preferably such that the weight ratio of the silane coupling agent to the nickel particles is in the range of from 0.1 to 0.5, more preferably from 0.2 to 0.4. By addition of that amount of the silane coupling agent, the conductor film which is obtained by firing the ink of the invention exhibits sufficiently increased electroconductivity as well as sufficiently improved adhesion to a substrate and surface smoothness. While the weight ratio of the coupling agent to nickel particles is as recited supra, the concentration of the silane coupling agent itself in the ink is preferably 0.4% to 40%, more preferably 1% to 40%, even more preferably 1% to 25%, by weight provided that the weight ratio to nickel particles falls within the recited range.

The ink of the invention is a dispersion of the aforementioned nickel particles in a dispersion medium. At least one organic solvent is used as the dispersion medium. The dispersion medium comprises as a main solvent a glycol having a boiling point of 300° C. or lower at ambient pressure (1 atm). If a main solvent having a boiling point exceeding 300° C. is used, the solvent is gasified in the step of firing, and the gas can cause fine cracks or voids to form in the coating film. As a result, it is difficult to form a dense conductor film and to secure good adhesion to various substrates. Moreover, the conductor film tends to have an increased electrical resistance. In the case where the dispersion medium comprises two or more organic solvents, the term "main solvent" does not always mean an organic solvent that forms a largest proportion of all the organic solvents. It is advisable not to use water as a dispersion medium, which does not mean that the ink of the invention is a water-free ink, though. It is rather preferred that a trace amount of water is present in the ink of the invention so as to facilitate smooth progress of hydrolysis of the silane coupling agent.

Examples of the glycol include ethylene glycol, diethylene glycol, triethylene glycol, tetraethylene glycol, propylene glycol, trimethylene glycol, dipropylene glycol, tripropylene glycol, 1,2-butylene glycol, 1,3-butylene glycol, 1,4-butylene glycol, pentamethylene glycol, and hexylene glycol. They can be used either individually or as a combination of two or more thereof. Particularly preferred of them are those having a viscosity of 100 mPa·sec or less at ambient temperature (20° C.). Use of a glycol having too high a viscosity makes it difficult to adjust the ink viscosity for application to inkjet printing. Examples of such glycols include ethylene glycol, diethylene glycol, propylene glycol, and 1,4-butylene glycol, with ethylene glycol being particularly preferred.

The main solvent is preferably used in an amount of 10% to 80%, more preferably 35% to 80%, even more preferably 35% to 70%, by weight based on the ink.

The ink of the invention contains other organic solvent in addition to the aforementioned main solvent as a dispersion medium. The other organic solvent is added to serve primarily as a surface tension modifier or a viscosity modifier. Addition of an organic solvent serving as a surface tension modifier or a viscosity modifier helps to adjust the surface tension or viscosity of the ink within a range suited for inkjet printing. It is preferred for the other organic solvent used as a surface tension modifier or a viscosity modifier to be compatible with the main solvent.

The surface tension modifier to be used preferably has a surface tension of 15 to 50 mN/m and a boiling point of 100° C. to 300° C. at atmospheric pressure. More specifically, an alkoxyethanol having 3 to 10 carbon atoms is used as a surface tension modifier. Using such an alkoxyethanol is advantageous to maintain ink quality for a prolonged period of time. Examples of the alkoxyethanol include 2-methoxyethanol, 2-ethoxyethanol, 2-propoxyethanol, and 2-n-butoxyethanol. Using 2-n-butoxyethanol is especially preferred to improve dispersibility of the nickel particles. Some of the main solvents described supra serve the function as a surface tension modifier, which depends on the type of the surface tension modifier used. When in using such a main solvent, there is no need to add a surface tension modifier separately.

The viscosity modifier to be used preferably has a boiling point of 100° C. to 300° C. at ambient pressure. The viscosity modifier preferably has a viscosity of 0.6 to 60 mPa·sec at 25° C. More specifically, an ether having 2 to 8 carbon atoms is used as a viscosity modifier. Examples of the ether include 1,4-dioxane, γ-butyrolactone, di-n-butyl ether. Using γ-butyrolactone is particularly preferred to improve the dispersibility of the nickel particles. Some of the main solvents described supra also serve the function as a viscosity modifier, which depends on the type of the surface tension modifier used. When in using such a main solvent, there is no need to add a viscosity modifier separately.

The amounts of the surface tension modifier and the viscosity modifier to be added are decided relative to the amount of the main solvent. The amount of the surface tension modifier is preferably such that the surface tension modifier to main solvent weight ratio is in the range of from 0.3 to 1.2, more preferably 0.7 to 1.2. The amount of the viscosity modifier is preferably such that the viscosity modifier to main solvent weight ratio is in the range of from 0.1 to 0.5, more preferably from 0.1 to 0.3. With the amounts of the surface tension modifier and the viscosity modifier being in the ranges recited, the ink of the invention is suitable to inkjet printing, and the nickel particles are well dispersed in the ink.

While the weight ratio of the surface tension modifier to the main solvent is as recited supra, the concentration of the surface tension modifier per se in the ink is preferably 5% to 60%, more preferably 5% to 50%, even more preferably 20% to 50%, by weight provided that the weight ratio recited above is met. The concentration of the viscosity modifier per se in the ink is preferably 1% to 50%, more preferably 4% to 50%, even more preferably 4% to 30%, by weight provided that the weight ratio recited above is fulfilled.

The proportion of the dispersion medium inclusive of the above described main solvent, surface tension modifier, and viscosity modifier in the ink is preferably 30% to 95%, more preferably 70% to 95%, by weight.

In view of suitability to inkjet printing, the ink of the invention preferably has a surface tension adjusted to be within a range of from 15 to 50 mN/m, more preferably 20 to 40 mN/m, and a viscosity at 25° C, adjusted to be within a range of from 0.6 to 60 mPa·sec, more preferably 2 to 40 mPa·sec, by addition of the above described surface tension modifier and viscosity modifier as a component of the dispersion medium.

The ink of the invention is prepared, for example, as follows. To begin with, nickel particles and a dispersion medium are mixed to prepare a mother nickel slurry. The mother nickel slurry is dispersed in a disperser and passed through a filter such as a membrane filter to remove agglomerates of the nickel particles. The concentration of the slurry is then adjusted by means of a centrifugal separator. A silane coupling agent and, if desired, a surface tension modifier and a viscosity modifier are added to the slurry, followed by mixing thoroughly to give a desired nickel ink.

The ink thus prepared is applied to a variety of substrates such as glass, indium tin oxide (ITO), silver, copper, and silicon by inkjet printing or with a dispenser. The coating film applied is fired preferably at 150° C. to 950° C., more preferably at 200° C. to 400° C. The firing atmosphere is not limited but preferably a nitrogen atmosphere, an argon atmosphere, or a hydrogen-nitrogen mixed atmosphere or the like. In the case of using a hydrogen-nitrogen mixed atmosphere, the hydrogen concentration is preferably about 1 to 4% by volume. In any firing atmosphere, the firing time is suitably about 0.5 to 2 hours.

The film obtained by the firing is electrically conductive and has a smooth surface (an average surface roughness Ra of 10 nm or smaller and a maximum surface roughness $R_{max}$ of 200 nm or smaller).

EXAMPLES

The present invention will now be illustrated in greater detail with reference to Examples, but it should be understood that the invention is not construed as being limited thereto.

(1) Preparation of Nickel Slurry

Fifty grams of nickel particles (NN-20 available from Mitsui Mining & Smelting Co., Ltd.; average primary particle size: 20 nm) and 950 g of ethylene glycol as a main solvent were mixed to prepare 1000 g of a mother nickel slurry.

(2) Dispersing Step

The mother nickel slurry was dispersed in a paint shaker (from Asada Works, Co., Ltd.) using zirconia beads (from Nikkato Corp.; diameter: 0.1 mm) as a medium for 30 minutes. The nickel slurry was further dispersed in a high-speed dispersing emulsifier (T. K. Filmix from Tokushu Kika Kogyo Corp.) to give a nickel slurry having nickel particles dispersed therein.

(3) Removal of Agglomerates

Agglomerates in the slurry were removed by passing the slurry through a membrane filter (from Advantec Toyo Kaisha, Ltd.; pore size: 0.45 μm) to give a nickel slurry free from coarse particles.

(4) Concentration Adjustment

The nickel slurry was centrifuged to adjust the nickel concentration to 21.0 wt % and again dispersed in T. K. Filmix (from Tokushu Kika Kogyo Corp.) to give a nickel slurry with the adjusted concentration.

(5) Preparation of nickel ink

To 102 g of the nickel slurry were added 5.4 g of a methyldimethoxysilane coupling agent (KBM-602 (trade name) from Shin-Etsu Silicones), 80.7 g of 2-n-butoxyethanol (from Wako Pure Chemical nd., Ltd.) as a surface tension modifier, and 16.2 g of γ-butyrolactone (from Wako Pure Chemical Ind., Ltd.) as a viscosity modifier. The mixture was dispersed in T. K. Filmix (from Tokushu Kika Kogyo Corp.) to give a nickel ink. The ink had a nickel particle concentration of 10.5 wt %, a silane coupling agent concentration of 2.6%, a 2-n-butoxyethanol concentration of 39.5%, and a γ-butyrolactone concentration of 7.9%. The dispersion medium concentration was 39.5%).

(6) Evaluation of Printability

The nickel ink had a viscosity of 24 mPa·sec as measured with a viscometer (VM-100A from Yamaichi Electronics Co., Ltd.) and a surface tension of 35 mN/m as measured with a surface tensiometer (DCW-100W from A & D Co., Ltd.). A wiring pattern (line-and-space: 100 μm; length: 2 cm) was printed on an alkali-free glass substrate (OA-10 from Nippon Electric Glass Co., Ltd.) with the ink using a commercially available inkjet printer (PM-G700 from Seiko Epson). The ink was successfully printed causing no clogging of the inkjet nozzle even when the printing was repeated 100 times and when printing was resumed after hour suspension. The wiring pattern was found satisfactory with neither breaking nor ink splash as observed under an optical microscope.

(7) Making of Conductor Film

The nickel ink was applied to an alkali-free glass substrate (OA-10 from Nippon Electric Glass Co., Ltd.) with a spin coater (from Mikasa Co., Ltd.) at 1000 rpm for 10 seconds, dried by heating at 100° C. for 10 minutes in the atmosphere, and fired at 300° C. for 1 hour in a hydrogen-nitrogen mixed atmosphere having a hydrogen concentration of 1% by volume to form a conductor film.

(8) Evaluation of Conductor Film

A cross-section of the conductor film was observed under a scanning electron microscope (FE-SEM from FEI Company). The film thickness was 400 nm. The conductor film had a specific resistance of $3.8 \times 10^{-3}$ Ω.cm as measured with a four-probe resistivity measuring device (Lorest GP from Mitsubishi Chemical Corp.).

The adhesion of the conductor film to the glass substrate was evaluated by the cross-cut test specified in JIS K5600-5-

6. As a result, the adhesion was rated as classification 0, indicating good adhesion. No peeling of the conductor film was observed under a microscope even after ultrasonic cleaning in water for 10 minutes and then in acetone for 10 minutes.

The surface of the conductor film was confirmed to be smooth under observation with a scanning electron microscope (FE-SEM from FEI Company). As a result of measurement of the film surface roughness with a profilometer (Surfcom 130A from Tokyo Seimitsu Co., Ltd.), Ra was 4 nm, and $R_{max}$ was 48 nm.

Comparative Example 1

A nickel ink was prepared in the same manner as in Example 1, except for using tetraethoxysilane (KBE-04 (trade name) available from Shin-Etsu Silicone) as a silane coupling agent. The concentration of each component of the ink was the same as in Example 1. A conductor film was formed in the same manner as in Example 1, and the surface roughness of the film was measured to find that Ra=38 nm and $R_{max}$=540 nm.

INDUSTRIAL APPLICABILITY

The nickel ink of the invention is suitable to form fine wiring and electrodes with high precision by coating with a dispenser or inkjet printing. A conductor film formed by using the nickel ink of the invention exhibits high adhesion to various substrates and circuits formed of different elements. A conductor film formed by using the nickel ink of the invention also has excellent surface smoothness. Accordingly, the nickel ink of the invention is well suited for applications to formation of electrodes and wiring on a variety of substrates including glass, indium tin oxide (ITO), silver, copper, and silicon.

The invention claimed is:

1. An ink consisting of metallic particles, a dispersion medium, and a methyldimethoxysilane coupling agent, wherein said metallic particles consist of nickel particles, the dispersion medium consisting of a glycol having a boiling point of 300° C. or lower at 1 atm, an alkoxyethanol having 3 to 10 carbon atoms, and an ether having 2 to 8 carbon atoms.

2. A method of producing a conductor film comprising applying an ink to a substrate and firing the resulting coating film at 150 to 950° C. to obtain a conductor film having an average surface roughness Ra of 10 nm or smaller and a maximum surface roughness $R_{max}$ of 200 nm or smaller,
wherein the ink consists of metallic particles, a dispersion medium, and a methyldimethoxysilane coupling agent, wherein said metallic particles consist of nickel particles, the dispersion medium consists of a glycol having a boiling point of 300° C. or lower at 1 atm, an alkoxyethanol having 3 to 10 carbon atoms, and an ether having 2 to 8 carbon atoms.

3. The method according to claim 2, wherein the ink has a surface tension within a range of 15 to 50 mN/m and a viscosity at 25° C. within a range of 0.6 to 60 mPa·sec.

4. The method according to claim 2, wherein the glycol is ethylene glycol, and the alkoxyethanol is 2-n-butoxyethanol, and the ether is γ-butyrolactone, and which is for use in inkjet printing.

5. The method according to claim 2, wherein the nickel particles have an average primary particle size of 3 to 150 nm.

6. The method according to claim 2, wherein the nickel ink is applied by inkjet printing.

7. The method according to claim 2, wherein the resulting coating film is fired under a hydrogen-nitrogen atmosphere.

8. The method according to claim 7, wherein a hydrogen concentration of the atmosphere is about 1 to 4% by volume.

9. The method according to claim 2, wherein the resulting coating film is fired for about 0.5 to 2 hours.

* * * * *